United States Patent [19]

Port et al.

[11] Patent Number: 5,694,086

[45] Date of Patent: Dec. 2, 1997

[54] PRECISION, ANALOG CMOS ONE-SHOT AND PHASE LOCKED LOOP INCLUDING THE SAME

[76] Inventors: Adrian George Port, 197 Pioneer Dr., Lansdale, Pa. 19446; Charles Donald Spackman, R.D. 4, Chester Springs, Pa. 19425

[21] Appl. No.: 608,352

[22] Filed: Feb. 28, 1996

[51] Int. Cl.[6] .................................................. H03K 3/284
[52] U.S. Cl. ........................... 331/1 A; 331/34; 331/57; 331/2; 327/227; 327/159; 375/376
[58] Field of Search ............................. 331/57, 1 A, 34; 327/244, 250, 252, 278, 227, 156, 158, 159

[56] References Cited

U.S. PATENT DOCUMENTS

| | | | |
|---|---|---|---|
| 3,241,087 | 3/1966 | Gossel | 331/113 |
| 4,103,251 | 7/1978 | Glick | 331/1 A |
| 4,122,361 | 10/1978 | Clemen et al. | |
| 4,316,150 | 2/1982 | Crosby | 331/1 A |
| 4,369,515 | 1/1983 | Valdes | 375/108 |
| 4,590,602 | 5/1986 | Wolaver | 375/120 |
| 4,633,193 | 12/1986 | Scordo | 331/1 A |
| 4,667,168 | 5/1987 | Shiomi et al. | 331/1 R |
| 4,742,313 | 5/1988 | Kawai | 331/1 A |
| 4,800,295 | 1/1989 | Minuhin et al. | 307/273 |
| 4,800,340 | 1/1989 | Maimone et al. | 331/1 A |
| 4,829,258 | 5/1989 | Volk et al. | 328/155 |
| 5,012,142 | 4/1991 | Sonntag | 307/602 |
| 5,039,893 | 8/1991 | Tomisawa | 307/597 |
| 5,105,108 | 4/1992 | Ngo | 307/603 |
| 5,124,669 | 6/1992 | Palmer et al. | 331/1 A |
| 5,131,014 | 7/1992 | White | 375/119 |
| 5,134,637 | 7/1992 | Beyer et al. | 375/119 |
| 5,159,205 | 10/1992 | Gorecki et al. | 307/269 |
| 5,313,503 | 5/1994 | Jones et al. | 375/120 |
| 5,345,186 | 9/1994 | Lesmeister | 328/155 |
| 5,382,921 | 1/1995 | Estrada et al. | 331/1 A |
| 5,406,592 | 4/1995 | Baumert | 375/376 |
| 5,418,496 | 5/1995 | Ford et al. | 331/2 |
| 5,436,938 | 7/1995 | Pigeon | 375/376 |

*Primary Examiner*—Timothy P. Callahan
*Assistant Examiner*—An T. Luu

[57] ABSTRACT

A precision CMOS one-shot having a delay proportional to a bias voltage. The bias voltage is generated by a phase locked loop which produces a bias voltage to control a voltage controlled oscillator (VCO) where the bas voltage is proportional to a difference between a first oscillatory signal and a reference oscillatory signal. Each CMOS one-shot includes a delay section for receiving the input signal and delaying production of the output signal. A current source supplies a current proportional to the bias voltage to said delay section, and the delay introduced by the delay section is proportional to the current. A latch sets the output signal of the delay section to a predetermined level after said delay has passed. An inverter is connected to an output terminal of the delay section and inverts the output signal from the delay section to generate the output signal of the one-shot. The precision one-shots may be used in a phase locked loop. The phase locked loop includes a phase error detection enable circuit that enables detection of the phase error when edge transitions are present in the data signal. This prevents clock signal generated by the phase locked loop from drifting during periods when the dam signal lacks transition. The phase locked loop is formed from a plurality of precision CMOS one-shots. The one-shots are designed using similar geometric layout on a common silicon substrate to reduce problems associated with CMOS process variation. The bias voltage, generated by a coarse phase locked loop, is applied to all the one-shots in the device to assure accurate timing.

10 Claims, 6 Drawing Sheets

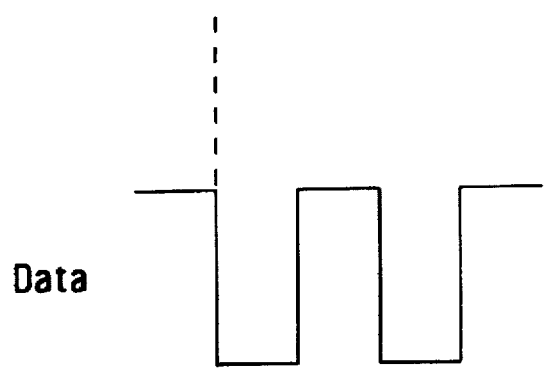
Data  Fig. 4a
CLK  Fig. 4b
Enable  Fig. 4c
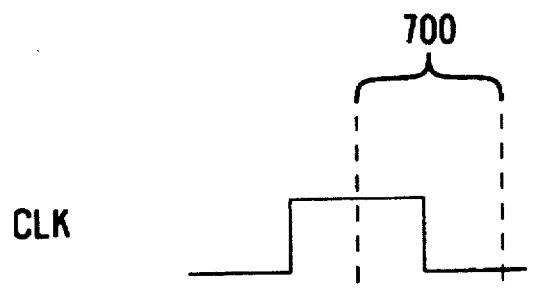
CLK  Fig. 5a
CLK  Fig. 5b
CLK  Fig. 5c

PRECISION, ANALOG CMOS ONE-SHOT AND PHASE LOCKED LOOP INCLUDING THE SAME

BACKGROUND OF THE INVENTION

The present invention relates generally to monostable multivibrators (one-shots) and in particular to a precision CMOS one-shot and a phase locked loop including precision CMOS one-shots.

One-shots are devices that produce an output signal delayed a predetermined time after an input event, such as a negative transition in an input signal. Typically, the delay of the one-shot is generated using external components such as a resistor and capacitor combination. Resistors and capacitors, however, have values that vary from one component to the next. Another problem faced in producing a CMOS one-shot having a precise delay is process variation. Typically, the process variation in fabricating CMOS devices can vary from 50% to 150% and is a significant problem in CMOS design. This process variation, along with the variations in the values for external components such as resistors and capacitors, has made it difficult to produce an analog CMOS one-shot having a precise and consistent delay.

SUMMARY OF THE INVENTION

The present invention is precision CMOS one-shot having a delay proportional to the frequency of a reference oscillatory signal. A reference controlled precision CMOS one-shot circuit includes a reference oscillator which generates a reference oscillatory signal having a reference frequency. A bias voltage generator responsive to the reference oscillatory signal generates a bias voltage proportional to the reference frequency. A precision one-shot receives the bias voltage and provides a delay proportional to said bias voltage. Alternatively, the reference oscillator may be a variable oscillator. The delay of the precision one-shot may then be controlled by adjusting the frequency of the reference oscillator.

Each precision CMOS one-shot receives an input signal and a bias voltage and produces an output signal delayed from the input signal. The one-shot includes a delay section for receiving the input signal and delaying production of the output signal. A current source supplies a current proportional to the bias voltage to said delay section, and the delay introduced by the delay section is proportional to the current. A latch sets the output signal of the delay section to a predetermined level after said delay has passed. An inverter is connected to an output terminal of the delay section and inverts the output signal from the delay section to generate the output signal of the one-shot.

The precision one-shot of the present invention may be embodied in a phase locked loop system which quickly synchronizes a local clock signal to transitions of an externally supplied data signal having a nominal frequency. The system includes a reference oscillator and a bias voltage generator which generates a bias voltage proportional to the frequency of the output signal of the reference oscillator. A second oscillator is responsive to a bias voltage and a phase error signal and produces a clock signal. The second oscillator is a variable frequency oscillator made from precision CMOS one-shots. A phase error detection enable circuit, responsive to the bias voltage and the data signal, generates an enable signal. The phase error detection enable circuit is also made from precision CMOS one-shots. A phase error detection circuit, responsive to the enable signal, generates the phase error signal used by the second oscillator. In an alternative embodiment, an adjusted bias voltage, formed by combining the bias voltage and the phase error, is provided to the phase error detection enable circuit.

The variable frequency oscillator made from precision one-shots is formed by connecting the output terminal of a first one-shot to the input terminal of a second one-shot. The output terminal of the second one-shot is connected to the input terminal of the first one-shot through an inverter. This configuration produces an oscillatory signal at the output terminal of the first one-shot having a period substantially equal to twice the delay of each one-shot.

BRIEF DESCRIPTION OF THE DRAWINGS

FIGS. 4A–4C are timing diagrams for a portion of the system shown in FIG. 3.

FIGS. 5A–5C are waveform diagrams showing various input signals to the phase error detector of the system shown in FIG. 3.

DETAILED DESCRIPTION

Figure 1:
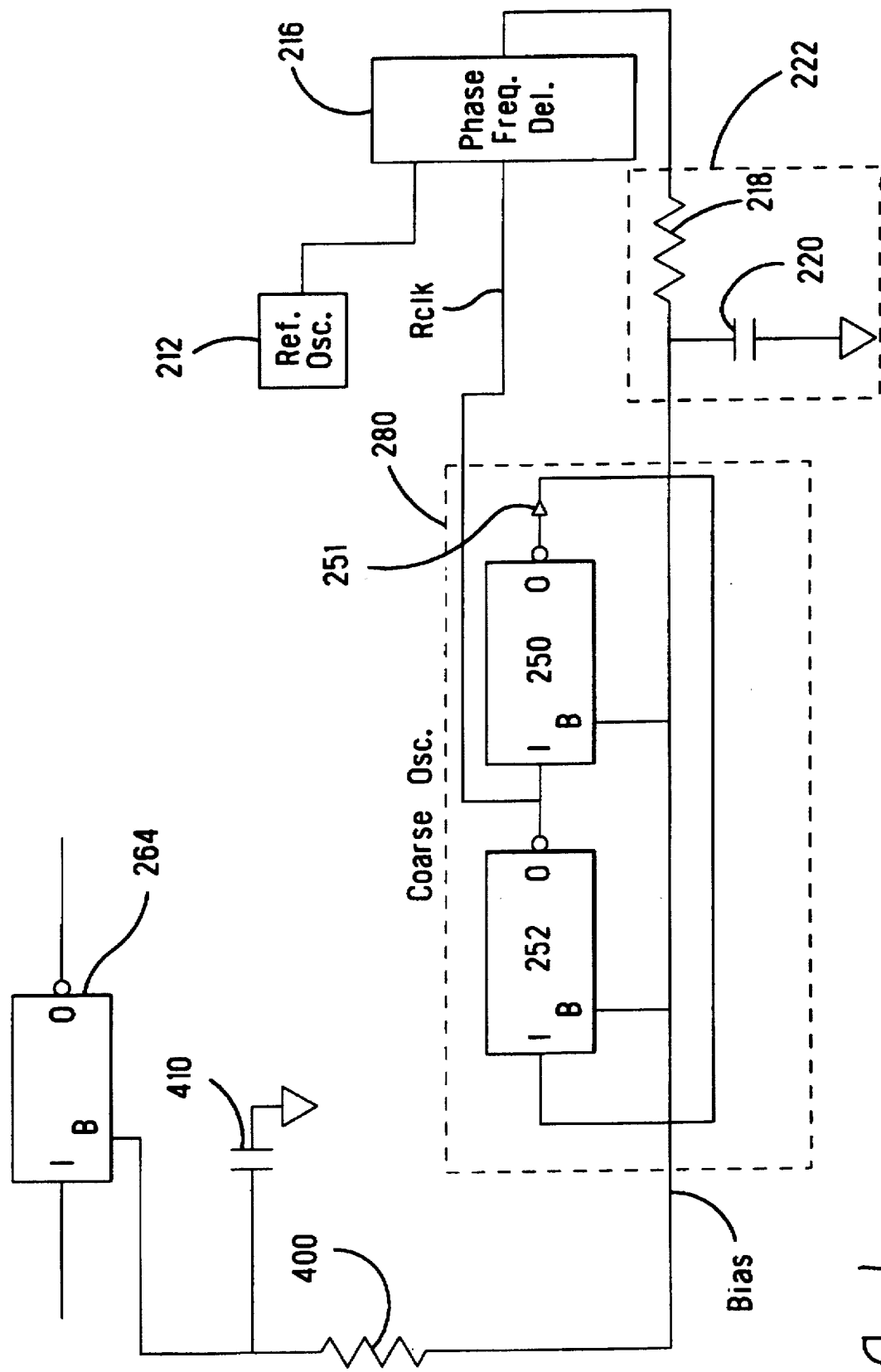
FIG. 1 is a schematic diagram of a reference controlled precision monostable multivibrator circuit.

FIG. 1 is a schematic diagram of a reference controlled precision CMOS one-shot circuit. The circuit includes three CMOS monostable multivibrators (one-shots) 250, 252 and 264. Each of the one-shots operates as follows. When the input signal applied to the input terminal I of the one-shot goes from a logic-low to a logic-high (positive transition), the one-shot output signal at output terminal 0 is reset to a logic-low. When the input signal to the one-shot goes from a logic-high to a logic-low (negative transition), the one-shot produces a logic-high output signal a variable delay time after the negative transition in the input signal. The variable delay time is inversely proportional to the bias voltage applied to the bias terminal B of the one-shot. The delay of the output signal of one-shots 250 and 252 is one half the period of the reference clock signal $R_{CLK}$.

A coarse oscillator 280 is formed from two ½ cycle delay CMOS one-shots 250 and 252 and an inverter 251. By connecting the output terminal 0 of one-shot 250 through the inverter 251 to the input terminal I of one-shot 252, and the output terminal 0 of one-shot 252 to the input terminal I of one-shot 250 (i.e. a loop), a voltage controlled oscillator (VCO) 280 is created which produces an output signal having a frequency and phase which are proportional to the bias voltage applied to each one-shot 250 and 252

The output signal from the coarse oscillator 280 is provided to a phase/frequency detector 216. The phase/frequency detector 216 is also coupled to a reference oscillator 212. The reference oscillator 212 may be a conventional resonant crystal controlled oscillator. Phase/frequency detector 216 outputs a voltage corresponding to the phase difference between the output signal of the coarse oscillator 280 and the signal produced by the reference oscillator 212. Resistor 218 and capacitor 220 provide a loop filter 222. The output voltage from the loop filter 222 is the bias voltage. The bias voltage is applied to the bias terminal B of one-shots 250, 252, and 264. As mentioned previously, the variable delay time of each one-shot is inversely proportional to the bias voltage. The phase/frequency detector 216 and the loop filter 222 adjust the bias voltage BIAS so that the phase and frequency of the output signal of the coarse oscillator 280 is matched to that of the output signal of the reference oscillator 212.

The bias voltage is applied to an integrating low-pass filter composed of resistor 400 and capacitor 410. This integrating filter removes any high frequency fluctuations in the bias voltage BIAS applied to the bias terminal of one-shot 264. The bias voltage is proportional to the frequency of the output signal of the reference oscillator 212. Because there is essentially no drift in the frequency of the output signal of the reference oscillator 212, the delay of the one-shot 264 remains constant and a precision one-shot is realized. As an alternative, the reference oscillator 212 may be a variable oscillator. The delay of the one-shot 264 may then be controlled by adjusting the frequency of the reference oscillator 212.

In the exemplary embodiment shown in FIG. 1, all of the one-shots can be CMOS devices. It is understood that the one-shots shown in FIG. 1 could be fabricated using different semiconductor technology. Typically, the process variation in fabricating CMOS devices can vary from 50% to 150% and is a significant problem in CMOS design. In the present invention, all the one-shots in FIG. 1 are produced using identical geometric layout on common substrate. The bias voltage applied to the coarse oscillator 280 is also applied to the one-shot 264. Because the devices are all on one substrate and their timing is controlled by the bias voltage generated by the coarse oscillator 280 and the reference oscillator 212, the timing of the delay introduced by one-shot 264 is accurate irrespective of any process variation.

Figure 2:
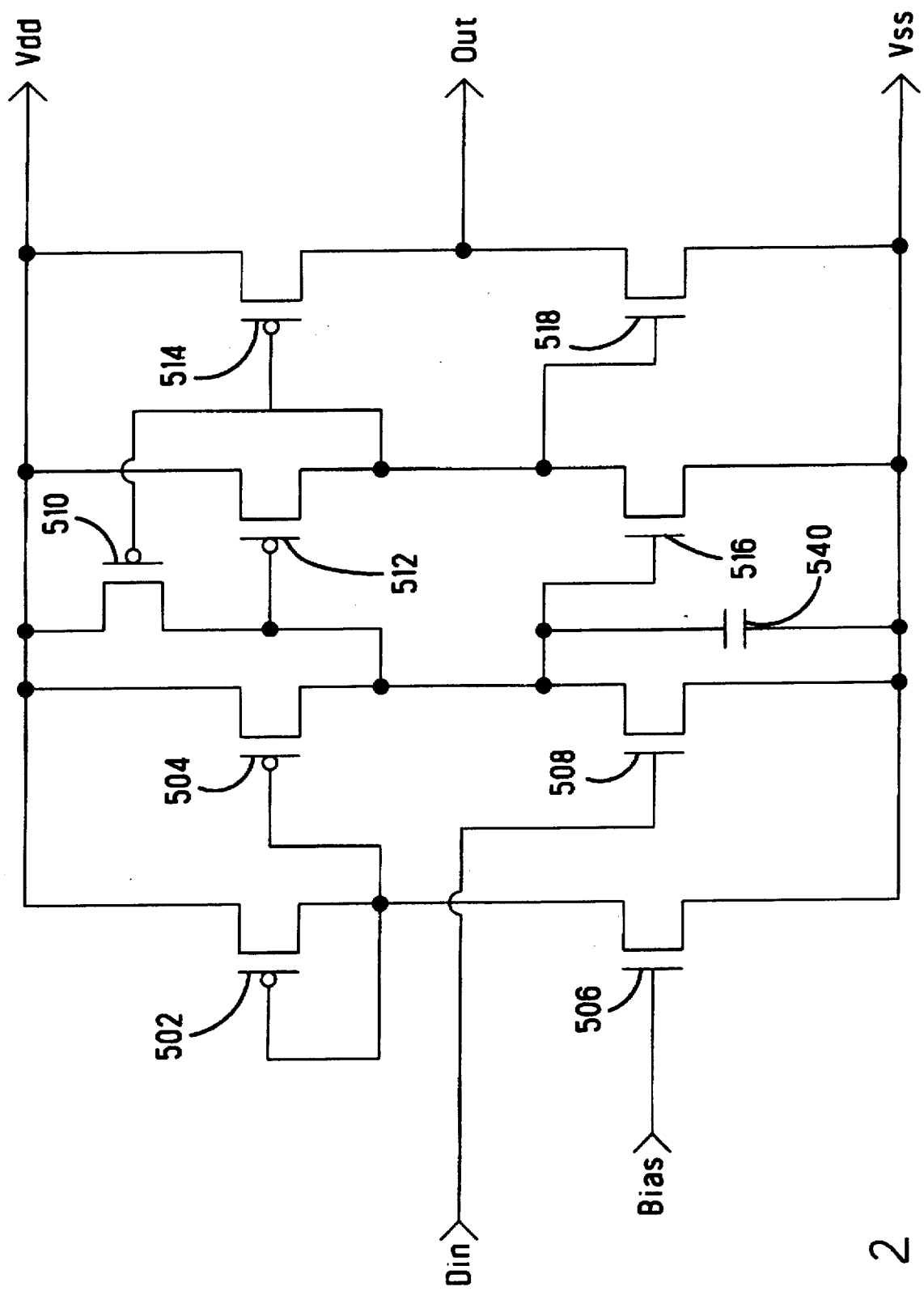
FIG. 2 is a schematic diagram of the precision monostable multivibrator shown in FIG. 1.

FIG. 2 is a circuit diagram of an exemplary CMOS one-shot circuit. The bias voltage applied to the bias terminal controls how much current flows though transistors 506, 502 and 504, which comprise a current source for supplying current to capacitor 540. Transistors 502 and 504 form a current mirror where, due to different channel widths, the current flow through transistor 504 is proportionally less than the current flow through transistor 502. In one embodiment, the channel width of transistor 504 is one fourth the channel width of transistor 502. Thus, the current flow through transistor 504 is one fourth of the current flow through transistor 502.

When the input signal din is a logic-high, transistor 508 is conductive which shorts capacitor 540 to a source of reference potential vss (e.g. ground) and connects the gate of transistor 516 to vss. This couples the gate of transistor 512 to vss, which causes transistor 512 to be conductive. Transistors 510 and 514 are not conductive while transistor 518 is conductive. The output terminal is connected to vss and a logic-low output signal is generated.

If a logic-low signal is applied to the input terminal din, transistor 508 becomes non-conductive. The current through transistor 504 now charges capacitor 540. The higher the bias voltage, the more current is supplied to capacitor 540. When capacitor 540 reaches the appropriate potential (e.g. 3 volts), transistor 516 becomes conductive and transistor 512 becomes non-conductive. Transistors 514 and 518 operate as an inverter so that the output signal at the output terminal OUT is the inverse of the logic level at the gates of transistors 518 and 514. Transistors 510 and 512 operate as a data latch which ensures that the voltage on capacitor 540 does not fluctuate above and below the threshold voltage of transistor 516 after that threshold voltage has been exceeded. When capacitor 540 reaches the threshold voltage of transistor 516, transistor 516 becomes conductive and connects the gate electrode of transistor 510 to vss. This renders transistor 510 conductive, causing capacitor 540 to quickly charge to a potential greater than the switching potential of transistor 516. When transistor 510 becomes conductive, it effectively couples the gate electrode of transistor 512 to a source of positive potential vdd. This causes transistor 512 to be non-conductive, to hold the potential at the gate electrode of transistor 510 at vss. The latch formed by transistors 510 and 512 ensures that the output signal of the one-shot will not fluctuate after capacitor 540 has charged to the switching potential of transistor 516.

Figure 3:
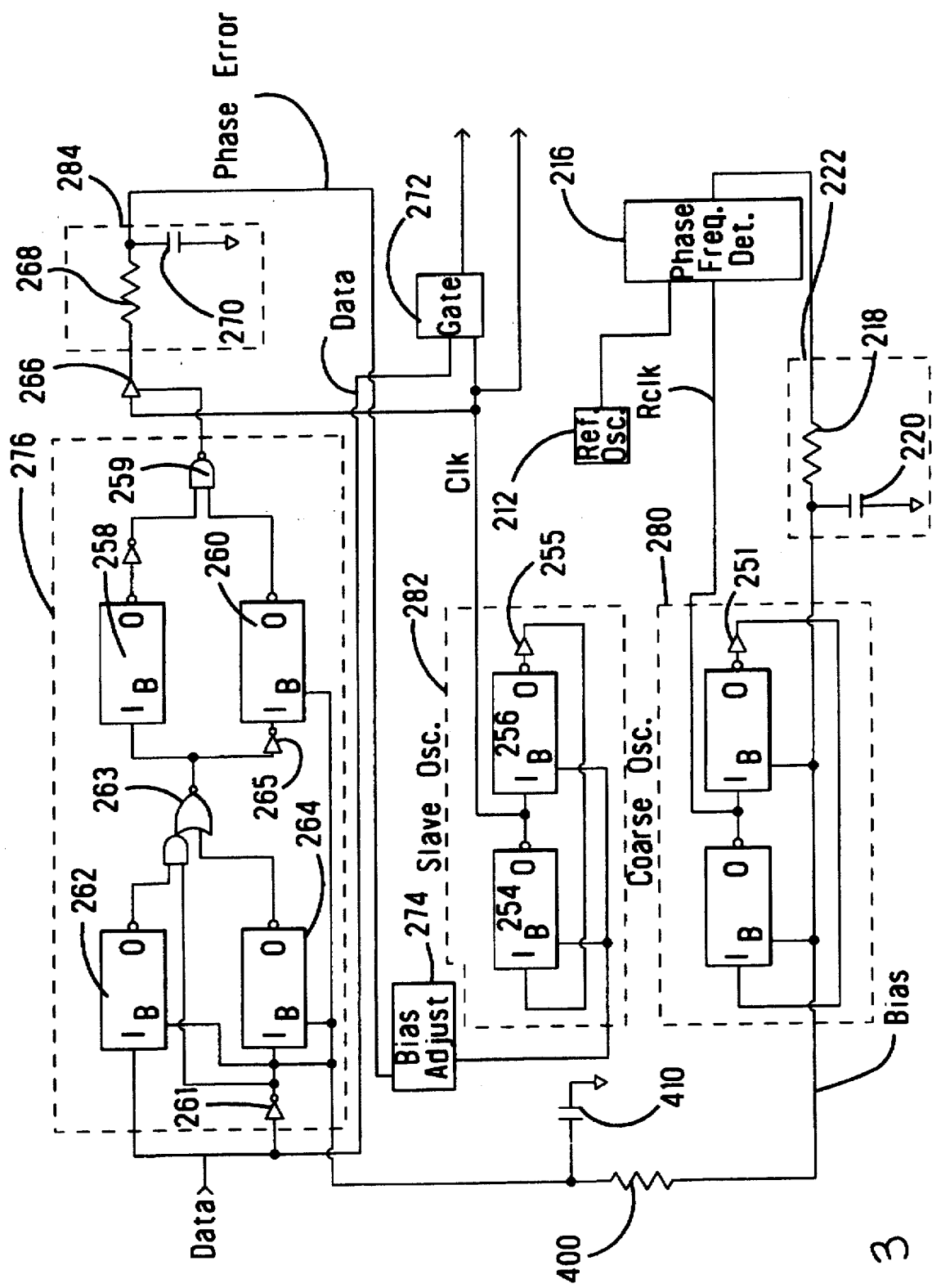
FIG. 3 is a schematic diagram of a phase locked loop including the reference controlled precision monostable multivibrator circuit shown in FIG. 1.

FIG. 3 is a schematic diagram of a phase locked loop incorporating a number of precision CMOS one-shots as shown in FIG. 1. The phase locked loop produces a clock signal CLK which is synchronized in phase to data transitions in an incoming DATA signal. The phase locked loop includes a coarse oscillator 280 and a fine oscillator 282. As described above, the coarse oscillator 280 is formed from two ½ cycle delay monostable multivibrators (one-shots) 250 and 252 and an inverter 251. The fine oscillator 282 is formed from two ½ cycle delay one-shots 254 and 256 and an inverter 255. The phase error detection enable circuit 276 includes two ½ cycle delay one-shots 258 and 260 and two ¼ cycle delay one-shots 262 and 264. The delay of the output pulse of one-shots 250, 252, 254, 256, 258 and 260 is one half the period of the reference clock signal $R_{CLK}$. It is assumed that the approximate frequency of the input dam is one half the frequency of the signal $R_{CLK}$. One-shots 262 and 264 generate a logic-high output signal delayed one-quarter period of the clock signal $R_{CLK}$ after a negative transition in the DATA signal.

As described above with reference to FIG. 1, the output terminal 0 of one-shot 250 through the inverter 251 to the input terminal I of one-shot 252, and the output terminal 0 of one-shot 252 to the input terminal I of one-shot 250 (i.e. a loop), a voltage controlled oscillator (VCO) 280 is created which produces an output signal having a frequency and phase which are proportional to the bias voltage applied to each one-shot 250 and 252. In this embodiment, the reference oscillator 212, located at a receiver, may be a resonant crystal controlled oscillator identical to a resonant oscillator located at the transmitter (not shown in the drawings).

The fine oscillator 282 is similarly formed from two ½ cycle delay one-shots 254 and 256 and an inverter 255. The output signal from the fine oscillator 282 is the recovered clock signal CLK. A bias adjusting circuit 274 receives the bias voltage provided by loop filter 222 via the low-pass filter formed by resistor 400 and capacitor 410 and a phase error signal provided by loop filter 284. The generation of the phase error signal is described below. The output signal from the bias adjusting circuit 274 is an adjusted bias voltage. The frequency and phase of the clock signal CLK is controlled by the adjusted bias voltage provided to the bias terminals B of one-shots 254 and 256. The CLK signal is provided to an output gate 272 which samples the received DATA signal.

The phase error detection enable circuit 276 includes two ¼ cycle delay one-shots 262 and 264 and two ½ cycle delay one-shots 258 and 260. The ¼ cycle delay one-shots 262 and 264 produce a logic-high output signal one quarter cycle after a negative transition in the signal applied to input terminals I. Similarly, the ½ cycle delay one-shots 258 and 260 produce a logic-high output signal one half cycle after a negative transition in the input signal applied to input terminals I. The difference in the construction of the ¼ cycle delay one-shots 262 and 264 and the ½ half cycle delay one-shots 258 and 260 is as follows. In the ½ cycle delay one-shots 258 and 260, the ratio of the channel width of transistor 502 to 504 (shown in FIG. 2) is four to one. Thus, transistor 504 conducts one fourth of the current conducted by transistor 502. In the ¼ cycle delay one-shots 262 and 264, the ratio of the channel width of transistor 502 to 504 (shown in FIG. 2) is two to one and transistor 504 conducts one half of the current conducted by transistor 502. Adjusting the ratio of the channel width of transistors 502 and 504 sets the amount of delay in the one-shot. As transistor 504 conducts more current, capacitor 540 charges more rapidly and reduces the delay of the one-shot. Alternatively, the capacitance of capacitor 540 could be modified to increase or decreases its charge time. The capacitance of capacitor 540 is inversely proportionally to the delay time of the one-shot.

Referring to FIG. 3, when a negative transition is present in the incoming DATA signal, the phase error detection enable circuit 276 provides a phase error detection enable signal to an output enable terminal of tri-state buffer 266. The phase error detection circuit 276 may also be configured to produce the phase error detection enable signal upon the occurrence of a positive transition in the DATA signal.

The DATA signal is applied to the input terminal I of one-shot 262, inverted by inverter 261 and applied to the input terminal I of one-shot 264. The combination of one-shots 262, 264 and NOR gate 263 produce a pulse having a duration equal to one half the period of the signal $R_{CLK}$ delayed from a negative transition edge in the DATA signal by one fourth the period of the $R_{CLK}$ signal. The output pulse from the NOR gate 263 is provided to the input terminal I of one-shot 258 and inverted and applied to the input terminal I of one-shot 260. One-shots 258 and 260, along with NAND gate 259, produce an output pulse having a duration equal to one half the period of the signal $R_{CLK}$. The phase error detection enable pulse is delayed from a negative transition in the DATA signal by three-fourths the period of the $R_{CLK}$ signal.

FIGS. 4A–4C illustrate the relationship between the phase error detection enable signal and the incoming DATA signal. In the example shown in FIG. 4A, a DATA signal including edge transitions is received by the phase error detection enable circuit 276 shown in FIG. 3. The ENABLE signal generated by the phase error detection enable circuit 276 is shown in FIG. 4C. The output signal from the phase error detection enable circuit 276 is a pulse having a duration of one half the period of the $R_{CLK}$ signal. When the output signal of the phase error detection enable circuit 276 is logic-high, the tri-state buffer 266 (shown in FIG. 3) is output enabled.

FIGS. 5A–5C illustrate in detail the relationship between the clock signal CLK and the phase error detection enable signal. The phase error detection enable signal establishes a window of time 700 during which the phase error of the clock signal CLK is determined. The phase error detection enable signal is always centered where an edge transition of the clock signal CLK would occur (as shown in FIGS. 4B and 4C) if the clock signal CLK were synchronized to the data signal. FIG. 5A illustrates the situation where the clock signal CLK is in phase with the DATA signal. As shown in FIG. 5A, the edge of the clock signal CLK is centered within the window 700. The tri-state buffer 266 samples the clock signal CLK during window 700. The sampled clock signal CLK is provided to loop filter 284 which produces an average voltage. If the clock operates from zero to five volts, the output of the loop filter 284 will be approximately 2.5 volts when the edge of the clock signal CLK is centered in the enable window 700.

Figure 6:
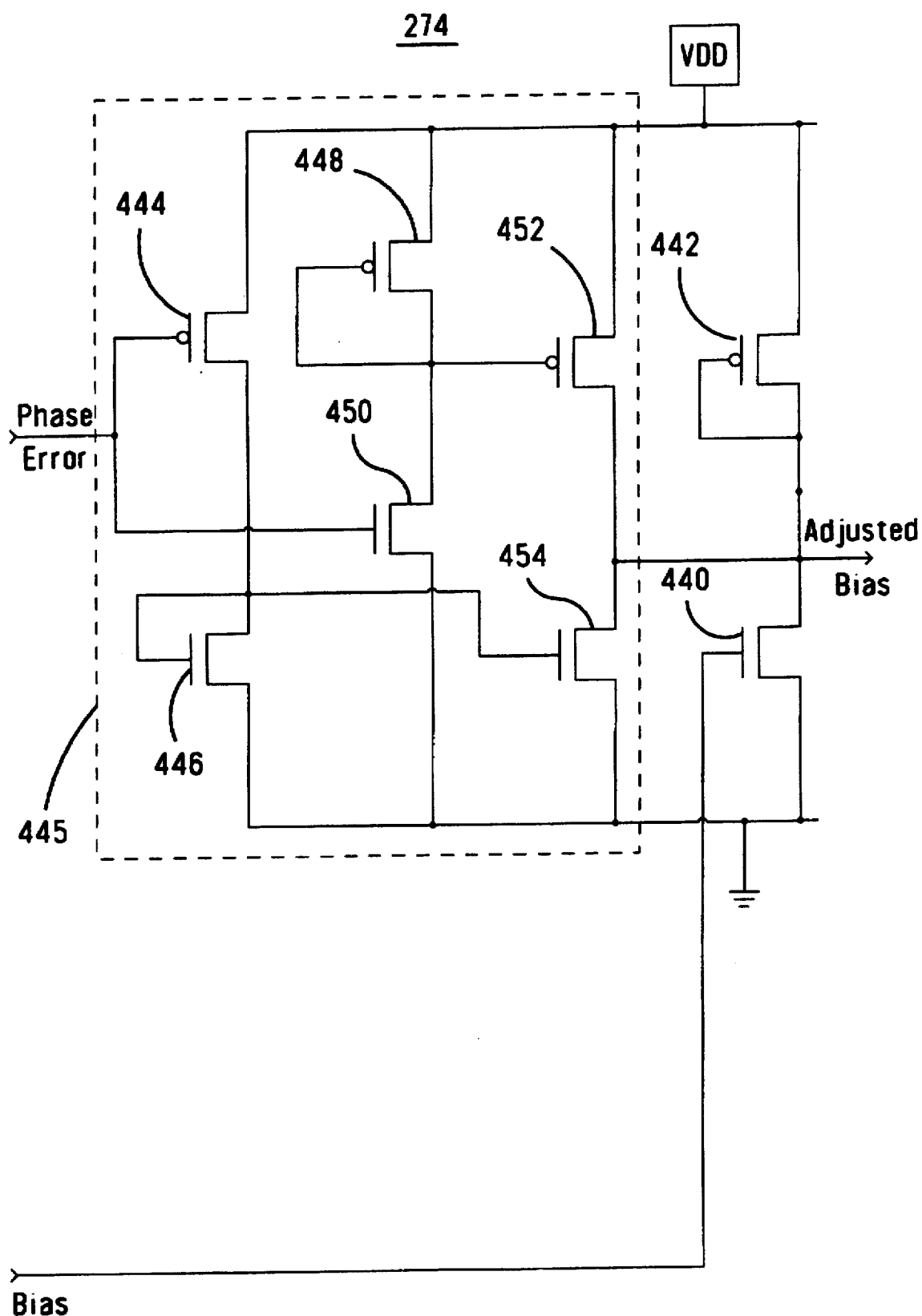
FIG. 6 is a schematic diagram of the bias adjusting circuit shown in FIG. 3.

The voltage from loop filter 284 represents the phase error between the DATA signal and the clock signal CLK. This voltage is provided to the bias adjusting circuit 274. FIG. 6 is a schematic diagram of the bias adjusting circuit 274. In the circuit 445, transistors 446 and 454 form a first current mirror and transistors 448 and 452 form a second current mirror. The input stage of the first current mirror is coupled to the source electrode of the transistor 444. The current drawn through the transistor 444 changes with the level of the phase error, applied to the gate electrode of transistor 444. This current is reflected, through the first current mirror to the junction of the transistors 452 and 454. In the same manner, the potential applied to the gate electrode of transistor 450 determines the current flow through the input leg of the second current mirror. This current flow is reflected through the second current mirror to the junction of the transistors 452 and 454. To the extent that the current flow through transistor 452 is not matched by the current flow through transistor 454, the excess current is provided to or drawn from the junction of the transistors 440 and 442. This differential current is summed with the current drawn by the transistor 440 in response to the bias voltage. The sum of the differential current and the current drawn in response to the bias voltage form the adjusted bias signal applied to the bias terminals B of one shots 254 and 256. Additional details of the operation of the first and second current mirror circuits are provided in the above-referenced U.S. Pat. No. 5,319,680.

The bias adjusting circuit 274 is configured so that when the negative transition the clock signal CLK is centered in the enable window 400 (as shown in FIG. 5A), the differential current is zero. Thus, when the edge of the clock signal CLK is centered in the enable window 700 as shown in FIG. 5A, the fine oscillator 282 receives the same bias voltage that is applied to the coarse oscillator 280.

FIG. 5B illustrates the situation where the negative transition of the clock signal CLK is behind its desired position (lagging). In this situation, the output signal of loop filter 284 is less than 2.5 volts. The bias adjust circuit 274 produces a negative differential voltage, which is added to the bias voltage from loop filter 222. This reduces the voltage applied to the bias terminal of one-shots 254 and 256. As discussed above, the delay of each one-shot is inversely proportional to the bias voltage. The reduced bias voltage thus increases the one-shot delay and shifts the edge of clock signal CLK in FIG. 5B to the right, towards the center of the enable window 700.

FIG. 5C illustrates the situation where the negative transition of the clock signal CLK is ahead of its desired position (leading). In this situation, the output signal of loop filter 284 is greater than 2.5 volts. The bias adjust circuit produces a positive differential voltage, which is added to the bias voltage from loop filter 222. This increases the voltage applied to the bias terminal of one-shots 254 and 256. The increased bias voltage reduces the one-shot delay and shifts the edge of clock signal CLK in FIG. 5C to the to the left, towards the center of the enable window 700.

In the exemplary embodiment, all of the one-shots shown in FIG. 3 can be CMOS devices. It is understood that the one-shots shown in FIG. 3 could be fabricated using different semiconductor technology. Typically, the process variation in fabricating CMOS devices can vary from 50% to 150% and is a significant problem in CMOS design. In the present invention, all the one-shots in FIG. 3 are designed using identical geometric layout on common substrate. The bias voltage applied to the coarse oscillator 280 is also applied to the one-shots located in the phase error detection enable circuit 276. Because the devices are all on one substrate and their timing is controlled by the bias voltage generated by the coarse oscillator 280 and the reference oscillator 212, the timing of the phase locked loops is accurate irrespective of any process variation.

Figure 7:
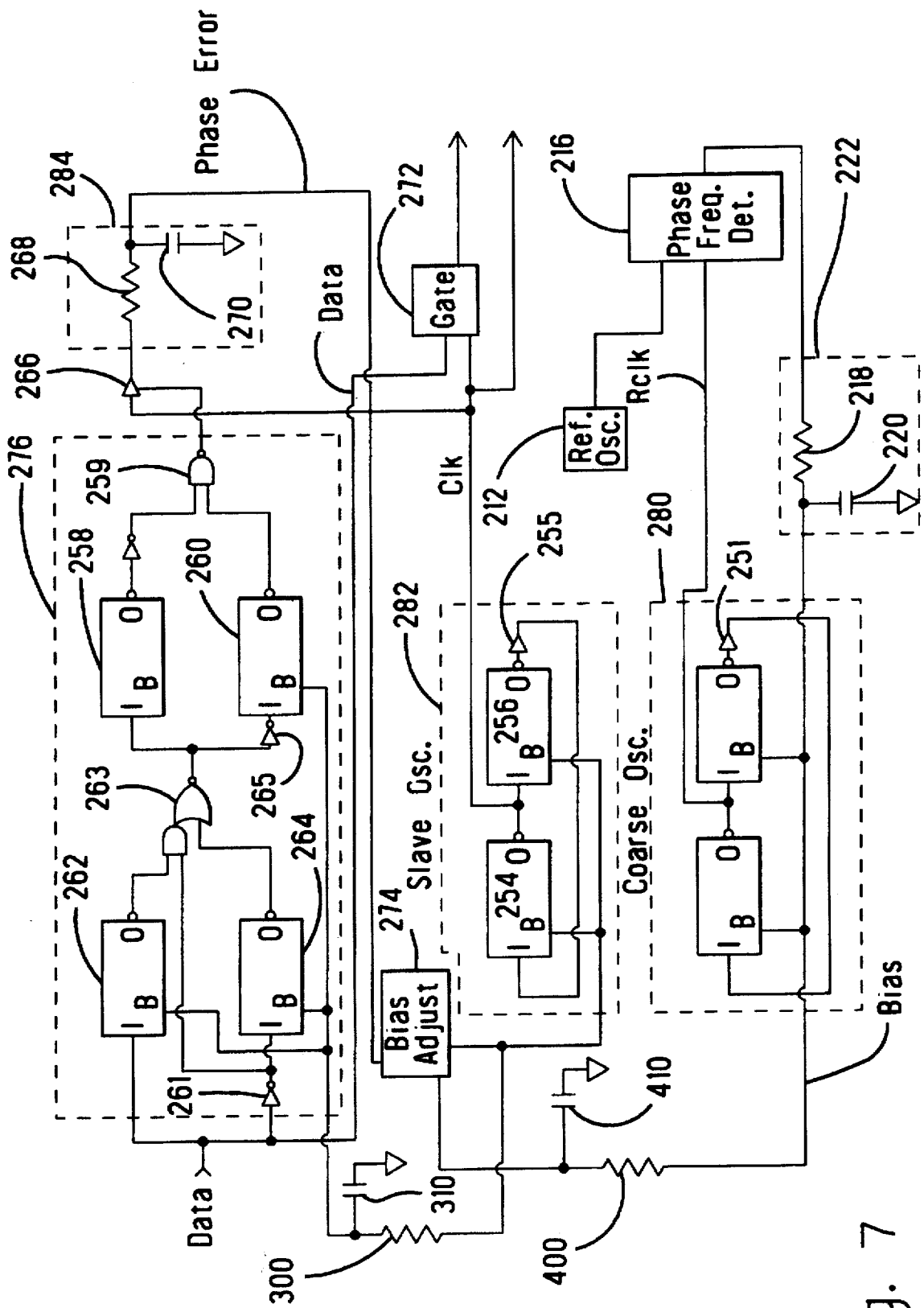
FIG. 7 is a schematic diagram of a variation of the circuit shown in FIG. 3.

FIG. 7 is a schematic diagram of a variation of the circuit shown in FIG. 3. In FIG. 7, the adjusted bias from bias adjusting circuit 274 is provided to an integrating low-pass filter including resistor 300 and capacitor 310. This filter removes high-frequency fluctuations in the adjusted bias voltage provided by the bias adjusting circuit 274. The filtered, adjusted bias is then supplied to the one-shots located in the phase error detection enable circuit 276. This allows the circuit shown in FIG. 7 to better track frequency variations of the DATA signal than the circuit shown in FIG. 3.

While the invention has been described with reference to exemplary embodiments, it is not limited thereto. Rather, the appended claims should be construed to include other variants and embodiments of the invention which may be made by those skilled in the art without departing from the true spirit and scope of the present invention.

What is claimed:

1. A CMOS integrated circuit comprising: reference oscillator means for generating a reference oscillatory signal having a reference frequency;

bias voltage generating means responsive to said reference oscillatory signal for generating a bias voltage proportional to said reference frequency;

phase error detection means responsive to the bias voltage and an external data signal for generating a phase error signal, a one shot circuit, coupled to the bias voltage generating means and the phase error detection means, for providing a delay proportional to said bias voltage and adjusted by said phase error signal.

2. A precision CMOS monostable multivibrator for receiving an input signal and a bias voltage and producing an output signal delayed from the input signal comprising:

a delay section for receiving the input signal and delaying production of the output signal;

a current source in said delay section for supplying a current proportional to the bias voltage to said delay section, wherein a delay introduced by said delay section is proportional to the current;

a latch for setting the output signal delayed by the delay section to a predetermined level after said delay;

an inverter having an input terminal coupled to an output terminal of said delay section for inverting the output signal from said delay section and generating the output signal of the monostable multivibrator; and bias voltage generator for producing said bias voltage in proportion to a reference frequency.

3. A precision CMOS monostable multivibrator of claim 2, wherein said delay section comprises a capacitor, wherein the delay introduced by said delay section is equal to a time used to charge the capacitor to a predetermined voltage responsive to the current provided by the current source.

4. A CMOS integrated circuit comprising:

reference oscillator means for generating a reference oscillatory signal having a reference frequency;

bias voltage generating means responsive to said reference oscillatory signal for generating a bias voltage proportional to said reference frequency;

phase error detection enable means, including at least one one-shot providing a delay proportional to said bias voltage, coupled to said bias voltage generating means; and voltage controlled oscillator means, including at least one one-shot providing a delay proportional to said bias voltage, coupled to said bias voltage generating means and said phase error detection enable means.

5. Apparatus for generating a clock signal which is locked in phase to a received data signal having intermittent transitions, comprising:

reference oscillator means for generating a reference oscillatory signal having a reference frequency;

bias voltage generating means responsive to said reference oscillatory signal for generating a bias voltage proportional to said reference frequency;

oscillator means, responsive to the bias voltage and a phase error signal, for producing said clock signal, said oscillator means including at least one CMOS one-shot providing a delay proportional to said bias voltage;

phase error detection enable means, responsive to said bias voltage and said data signal, for generating an enable signal, said phase error detection enable means including at least one CMOS one-shot providing a delay proportional to said bias voltage; and phase error detection means, responsive to said enable signal, said received data and said clock signal, for generating said phase error signal which changes in value responsive to differences in phase between respective transitions of said received data signal and said clock signal.

6. The apparatus of claim 5, wherein said bias voltage generating means comprises:

coarse oscillator means responsive to said bias voltage for producing a first oscillatory signal;

phase/frequency detecting means for comparing said reference oscillatory signal to said first oscillatory signal and producing an output signal proportional to a difference in phase between said reference oscillatory signal and said first oscillatory signal; and filtering means for receiving said output signal and producing said bias voltage.

7. The apparatus of claim 5, wherein said oscillator means includes two one-half cycle delay CMOS one-shots each responsive to said bias voltage.

8. The apparatus of claim 6, wherein said coarse oscillator means includes two one-half cycle delay CMOS one-shots each responsive to said bias voltage.

9. The apparatus of claim 5, wherein said phase error detection enable means includes two one-quarter cycle delay CMOS one-shots each responsive to said bias voltage and two one-half cycle delay CMOS one-shots each responsive to said bias voltage.

10. The apparatus of claim 5, wherein said phase error detection enable means generates a pulse having a duration equal to one half the period of the clock signal in response to a transition within said data signal.

* * * * *